(12) United States Patent
De Putter et al.

(10) Patent No.: US 8,142,964 B2
(45) Date of Patent: Mar. 27, 2012

(54) METHOD OF DESIGNING SETS OF MASK PATTERNS, SETS OF MASK PATTERNS, AND DEVICE MANUFACTURING METHOD

(75) Inventors: Sander De Putter, Eindhoven (NL); Jozef Maria Finders, Veldhoven (NL); Bertus Johan Vleeming, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 404 days.

(21) Appl. No.: 12/499,519

(22) Filed: Jul. 8, 2009

(65) Prior Publication Data

US 2010/0021827 A1  Jan. 28, 2010

Related U.S. Application Data

(60) Provisional application No. 61/083,690, filed on Jul. 25, 2008.

(51) Int. Cl.
*G03F 9/00* (2006.01)
*G03C 5/00* (2006.01)

(52) U.S. Cl. ......... 430/30; 430/312; 430/313; 430/315; 430/330; 430/394

(58) Field of Classification Search ............... 430/30, 430/312, 313, 315, 330, 394
See application file for complete search history.

(56) References Cited

U.S. PATENT DOCUMENTS

| | | | |
|---|---|---|---|
| 4,509,852 A | 4/1985 | Tabarelli et al. | |
| 5,994,009 A | 11/1999 | Tzu et al. | |
| 6,015,650 A * | 1/2000 | Bae | |
| 6,351,304 B1 * | 2/2002 | Kawashima et al. | |
| 7,781,149 B2 * | 8/2010 | Paxton et al. | |
| 2003/0196178 A1 | 10/2003 | Reuter et al. | |
| 2004/0058255 A1 | 3/2004 | Jessen et al. | |
| 2006/0119809 A1 | 6/2006 | Verhagen et al. | |
| 2007/0157139 A1 | 7/2007 | White et al. | |
| 2008/0010628 A1 | 1/2008 | Jung et al. | |
| 2008/0044739 A1 | 2/2008 | Konomi et al. | |
| 2008/0166661 A1 * | 7/2008 | Jung | |

FOREIGN PATENT DOCUMENTS

| | | | |
|---|---|---|---|
| EP | 1 420 298 A2 | 5/2004 | |
| EP | 1 420 300 A2 | 5/2004 | |
| JP | 6-324474 A | * 11/1994 | |
| JP | 9-205081 A | * 8/1997 | |
| JP | 10-010702 A | * 1/1998 | |
| JP | 2000-349011 A | * 12/2000 | |
| JP | 2005-252165 A | * 9/2005 | |
| JP | 2006-303504 A | * 11/2006 | |
| JP | 2008-172190 A | * 7/2008 | |
| WO | WO 99/49504 A1 | 9/1999 | |
| WO | WO 2005/064405 A2 | 7/2005 | |
| WO | WO 2008/059440 A2 * | 5/2008 | |

OTHER PUBLICATIONS

English-Lanquage Abstract of Japanese Patent Publication No. 6-324474 A, published Nov. 25, 1994, Japanese Patent Office; 1 page.
English-Language Abstract of Japanese Patent Publication No. 9-205081 A, published Aug. 5, 1997, Japanese Patent Office; 1 page.
English-Language Abstract of Japanese Patent Publication No. 10-010702 A, published Jan. 16, 1998, Japanese Patent Office; 1 page.
English-Language Abstract of Japanese Patent Publication No. 2000-349011 A, published Dec. 15, 2000, Japanese Patent Office; 1 page.
English-Language Abstract of Japanese Patent Publication No. 2005-252165 A, published Sep. 15, 2005, Japanese Patent Office; 1 page.
English-Language Abstract of Japanese Patent Publication No. 2006-303504 A, published Nov. 2, 2006, Japanese Patent Office; 1 page.
English-Language Abstract of Japanese Patent Publication No. 2008-172190 A, published Jul. 24, 2008, Japanese Patent Office; 1 page.
English-Language Translation of Notice of Reasons for Rejection directed to related Japanese Patent Application No. 2009-168334, mailed Jul. 25, 2011, Japanese Patent Office; 4 pages.

* cited by examiner

*Primary Examiner* — Christopher Young
(74) *Attorney, Agent, or Firm* — Sterne, Kessler, Goldstein & Fox P.L.L.C.

(57) ABSTRACT

In a multiple-exposure lithographic process a developed resist pattern derived from a first exposure is present within a second resist layer that is exposed in a second exposure of the multiple-exposure lithographic process. The second mask pattern used in the second exposure process includes at least one localized adjustment to at least one feature thereof to compensate for scattering effects of the developed resist pattern that is present when the second exposure is performed.

19 Claims, 5 Drawing Sheets

METHOD OF DESIGNING SETS OF MASK PATTERNS, SETS OF MASK PATTERNS, AND DEVICE MANUFACTURING METHOD

CROSS REFERENCE TO RELATED APPLICATIONS

This application claims the benefit under 35 U.S.C. §119(e) to Provisional Patent Application No. 61/083,690 filed Jul. 25, 2008, which is incorporated by reference herein in their entireties.

BACKGROUND

1. Field of the Invention

The present invention relates to methods of designing sets of mask patterns for use in multiple-exposure lithography processes, to sets of mask patterns and to device manufacturing methods.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include "steppers" and "scanners". In a stepper type lithographic apparatus each target portion is irradiated by exposing an entire pattern onto the target portion at one time. In a scanner type lithographic apparatus each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Known immersion lithographic techniques include a technique wherein there is an immersion of the substrate in a lithographic projection apparatus in a liquid having a relatively high refractive index, e.g., water, so as to fill a space between the final element of the projection system and the substrate. If water is used, it is desirably distilled water. Other liquids can be used. The present invention will be described with reference to "liquid". However, various fluids may be suitable, particularly wetting fluids, incompressible fluids and/or fluids with higher refractive index than air, desirably a higher refractive index than water. Fluids excluding gases are particularly preferred. An advantage derived from the use of fluids is to enable imaging of smaller features since exposure radiation will have a shorter wavelength in the liquid. The effect of the liquid may be regarded as increasing the effective numerical aperture (NA) of the system and increasing the depth of focus. Other immersion liquids have been utilized, including water with solid particles (e.g., quartz) suspended therein, or liquids with nano-particle suspensions (e.g., particles with a maximum dimension of up to about 10 nm). The suspended particles may or may not have a similar or the same refractive index as the liquid in which they are suspended. Other liquids, which may be suitable, are hydrocarbons, such as aromatics e.g., Decalin, and fluorohydrocarbons, and aqueous solutions.

However, submersing the substrate or substrate and substrate table in a bath of liquid, see, for example U.S. Pat. No. 4,509,852, which is incorporated by reference herein in its entirety, means that there is a large body of liquid that must be accelerated during a scanning exposure. This requires additional or more powerful motors and turbulence in the liquid may lead to undesirable and unpredictable effects.

A method for a liquid handling system, such as a liquid supply system, is to provide liquid on only a localized area of the substrate, such as, in between the final element of the projection system and the substrate using a liquid confinement structure (the substrate generally has a larger surface area than the final element of the projection system). One such method utilizing this approach is disclosed in WO 99/49504, which is incorporated by reference herein in its entirety. As illustrated in FIGS. 2 and 3 of this application, liquid is supplied by at least one inlet IN onto the substrate, desirably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 of this application shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of inlets and outlets positioned around the final element are possible. One example is illustrated in FIG. 3 in which four inlet/outlet sets are provided in a regular pattern around the final element.

Another method for a liquid handling system is to provide the system with a seal member which extends along at least a part of a boundary of the space between the final element of the projection system and the substrate table. Near the seal is a meniscus of the immersion liquid. The seal may confine the immersion liquid and so create the meniscus. As exposure light passes through the confined immersion liquid it may be considered optical liquid. Such an arrangement is illustrated in FIG. 4 of this application. The seal member is substantially stationary relative to the projection system in the XY plane though there may be some relative movement in the Z direction (in the direction of the optical axis). A seal is formed between the seal member and the surface of the substrate. Desirably, the seal is a contactless seal such as a gas seal, such as is disclosed in EP-A-1,420,298, which is incorporated by reference herein in its entirety and illustrated in FIG. 5 of this application.

EP-A-1,420,300, which is incorporated by reference herein in its entirety, discloses a twin or dual stage immersion lithography apparatus. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

WO2005/064405, which is incorporated by reference herein in its entirety, discloses an all wet arrangement in which the immersion liquid is unconfined. In such a system, the whole top surface of the substrate is covered in liquid. This is advantageous because then the whole top surface of the substrate is exposed to the same conditions. This has advantages for temperature control and processing of the substrate. In WO2005/064405, a liquid supply system provides liquid to the gap between the final element of the projection system and the substrate. The liquid between the final element of the projection system and the substrate during exposure is optical liquid. That liquid is allowed to leak over the remainder of the substrate. A barrier at the edge of a substrate table prevents the liquid from escaping so that it can be removed from the top surface of the substrate table in a controlled way. The meniscus of the liquid defining the extent of the immersion liquid is remote from the projection system. Although such a system improves temperature control and processing of the substrate, evaporation of the immersion liquid can still occur. One way of alleviating that problem is described in US 2006/119809, which is incorporated by reference herein in its entirety, in which a member is provided which covers the substrate W in all positions and which is arranged to have immersion liquid extending between it and the top surface of the substrate and/or substrate table which holds the substrate.

In order to produce features of ever smaller critical dimensions, various methods have been used to form features smaller than allowed by the diffraction limit. Some processes involve two lithographic steps to produce a single layer of a device. These methods are often referred to as double-patterning processes. One such process involves exposing a first resist layer provided over a hardmask with a first pattern, developing the first pattern and etching it into the hardmask, applying a second hardmask, a thick layer of anti-reflection coating (ARC) and a second resist layer, exposing the second resist layer with a second pattern, developing the second pattern and etching it into the second hardmask, then transferring the combined pattern in the hardmask into the substrate. Such a process, often referred to as a Litho-Etch-Litho-Etch or LELE process, is disadvantageous as the substrate must be removed from the lithocell (lithography apparatus and associated track) to perform the etch steps, which causes delay and provides additional opportunity for contamination of the substrate.

There have been various methods to "freeze" the first pattern in the first resist so that the second resist can be coated directly over it and exposed to the second pattern without eradicating the first pattern. This can be advantageous if the "freezing" process can be carried out without removing the substrate from the track. One suggested "freezing" process involves baking the developed first resist so that it undergoes a chemical reaction, e.g., cross-linking between polymer chains, rendering it less solvent in the solvent of the second resist. Another suggested "freezing" process involves coating the developed second resist with a substance that reacts with it, possibly when heated, to form a protective layer. Another suggested double patterning process avoids an intermediate etch step and uses a positive resist for the first exposure and a negative resist for the second exposure, ensuring that the features formed in the first exposure are not irradiated in the second exposure.

Other processes to produce smaller pitches than the limit of a single exposure step include so-called spacer techniques. In these processes, a resist is exposed with a first repeating pattern which is etched into a hardmask. The patterned hardmask is coated with a spacer material that forms a conformal coating. A controlled etch of the conformal coating is performed so that only spacers of controlled width on the sides of the hardmask features remain. The hardmask features are then etched away leaving only the spacers, which have a pitch half that of the hardmask features. There is also a dual-tone process which uses a resist that effectively has two thresholds to exposure radiation, which remains hard when exposed to the higher threshold and less than the lower threshold so that only areas that have been exposed to an intermediate amount are washed away in the development process.

However, none of the above processes is ideal. The double patterning processes involve two expensive lithography steps, even if an intermediate etch is avoided. They are also sensitive to overlay errors between the two patterning steps and other imaging errors. The spacer and dual-tone resist processes are typically only useful to form repeating structures, e.g., in memory, rather than logic-type structures. Therefore, what is needed is an improved process by which features of a critical dimension smaller than the limit of a single exposure step can be formed.

SUMMARY

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention. Consistent with the principles of the present invention as embodied and broadly described herein, the following summarizes certain embodiments of the invention.

In an embodiment of the present invention, there is provided a device manufacturing method comprising exposing a first resist layer on a substrate to a first mask pattern to generate a first latent resist pattern, developing the first latent resist pattern to produce a developed resist pattern, coating the substrate with a second resist layer, which covers the developed resist pattern, and exposing the second resist layer to a second mask pattern, wherein the second mask pattern includes a localized pattern adjustment based upon the first pattern.

In another embodiment of the present invention, there is provided a method of multiple-exposure lithographic process comprising using a first subset of features of a first mask pattern during a first exposure period, using a second subset of features of a second mask pattern during a second exposure period, and performing a localized adjustment to at least one feature of the second subset of features in the second mask pattern, wherein the adjustment is based on the features of the first mask pattern.

In a further embodiment of the present invention, there is provided a method comprising generating a first mask pattern to be formed on a substrate, wherein the first mask pattern comprises a first subset of features of a desired pattern and generating a second mask pattern to be formed on a substrate, wherein the second mask pattern is exposed after the first mask pattern is exposed in a lithographic process in which the second mask pattern comprises a second subset of features of the desired pattern, wherein a feature of the second subset of the features of the desired pattern has been adjusted based on the first subset of the desired features.

In a further embodiment of the present invention, there is provided a system comprising a first mask comprising a first substrate including a first patterned layer having a first set of features, and a second mask comprising a second substrate including a second patterned layer having a second set of features wherein a feature of the second subset of features of the desired pattern has been adjusted based on the first subset of the desired features.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

One or more embodiments of the present invention will now be described with reference to the accompanying drawings.

DETAILED DESCRIPTION

This specification discloses one or more embodiments that incorporate the features of this invention. The disclosed embodiment(s) merely exemplify the invention. Thus, "embodiments" are views of the invention, but each does not itself represent the entire invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
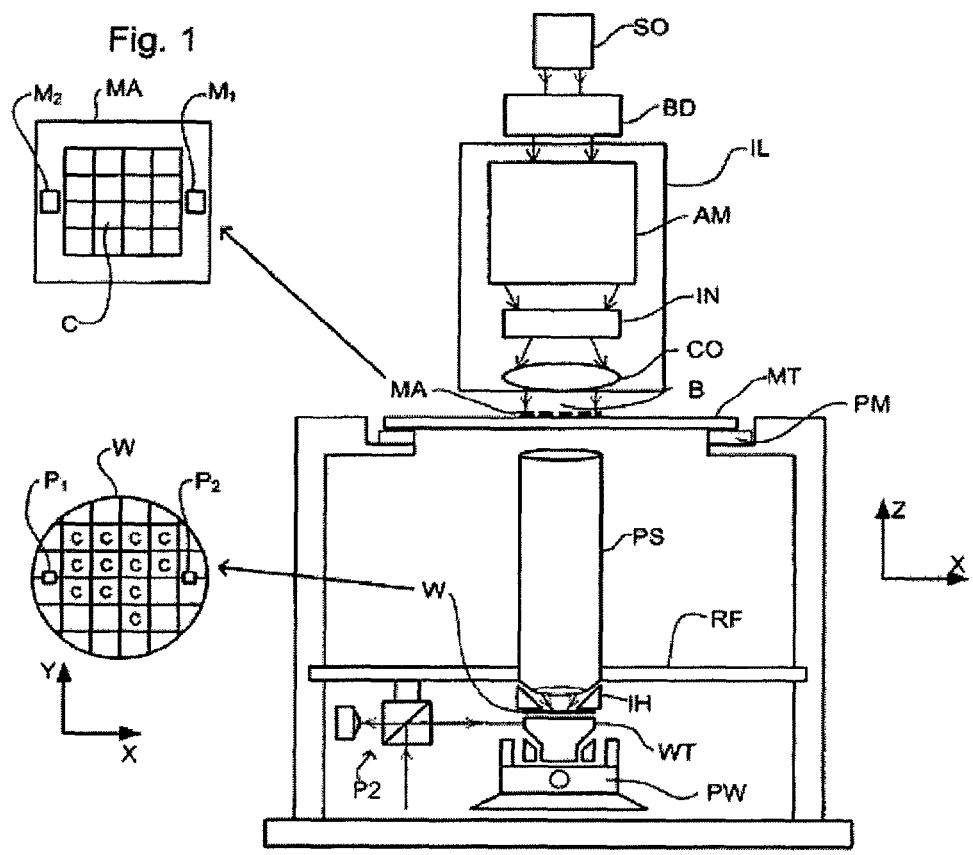
FIG. 1 depicts a lithographic apparatus which may be used to put the present invention into practice.

FIG. 1 schematically depicts a lithographic apparatus according to one embodiment of the invention. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor P2 (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies. A fluid handling structure IH, which is described further below, controls a localized area of immersion liquid between the projection system PS and the substrate W.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may be employed additionally or in the alternative.

Figure 5:
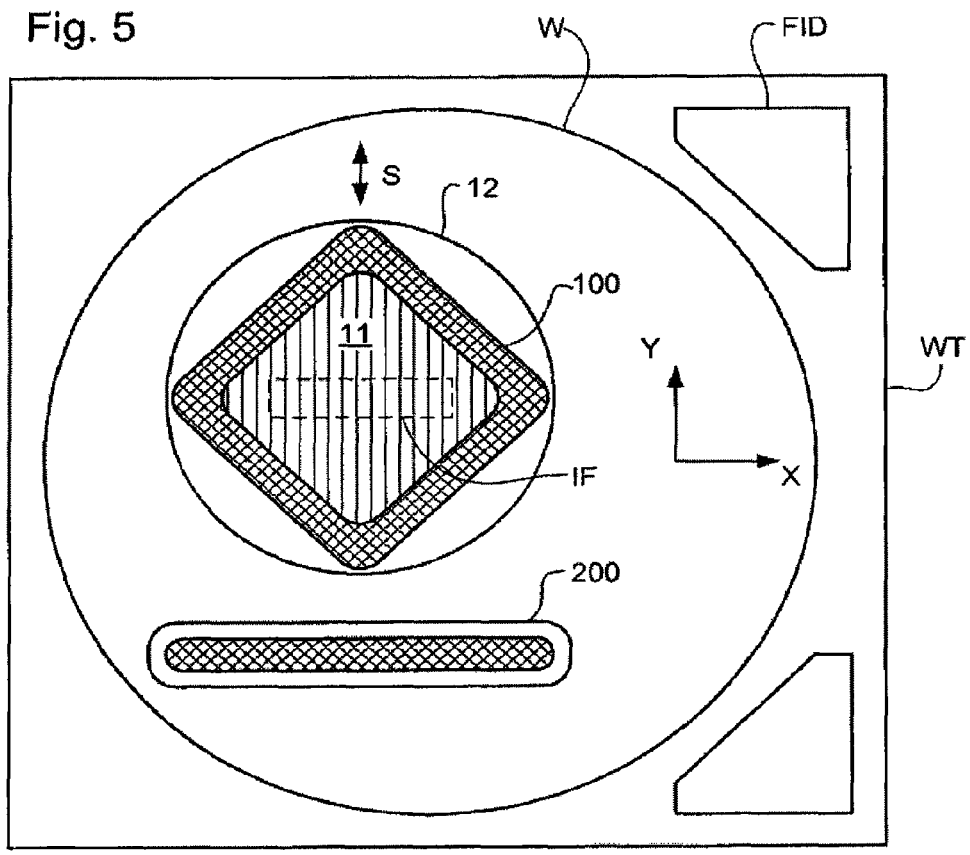
FIG. 5 depicts parts of a substrate stage in a lithographic apparatus, including a structure for handling fluid to control a localized area of immersion liquid on a substrate held on a substrate table and a liquid removal device to remove liquid from the substrate.

FIG. 5 depicts schematically fluid handling arrangements of the substrate stage in more detail. In particular, a fluid handling structure 12 is provided to supply and confine an immersion liquid to a space between the final element of the projection system PS (not shown in this figure) and the substrate W and/or substrate table. (Note that reference to the substrate herein includes references to the substrate table in the alterative or as an addition, unless stated to the contrary).

This structure includes a liquid removal device 100 and is described further below. During the course of a series of exposures and measurements carried out on a substrate W, the substrate table WT is moved relative to the projection system PS (see FIG. 1) and fluid handling structure 12 at high speeds and with high accelerations. At various times, e.g., when exposing edge dies and when making measurements using sensors provided in sensor block FID, the edge of the substrate may pass under the localized body of immersion liquid 11. This, and large accelerations or changes in direction of the substrate table WT can cause droplets or films to break away from the body of immersion liquid and be left behind on the substrate, substrate table and/or sensors FID. A droplet and a film left on the substrate can cause problems by causing localized cooling and hence distortion of the substrate. A droplet or film may deposit dissolved or suspended contaminants and/or by attracting contaminants from the environment. Therefore, the liquid removal system 100 is intended to minimize the creation of droplets left on the substrate by stabilizing the meniscus of the body of immersion liquid.

Figure 2:
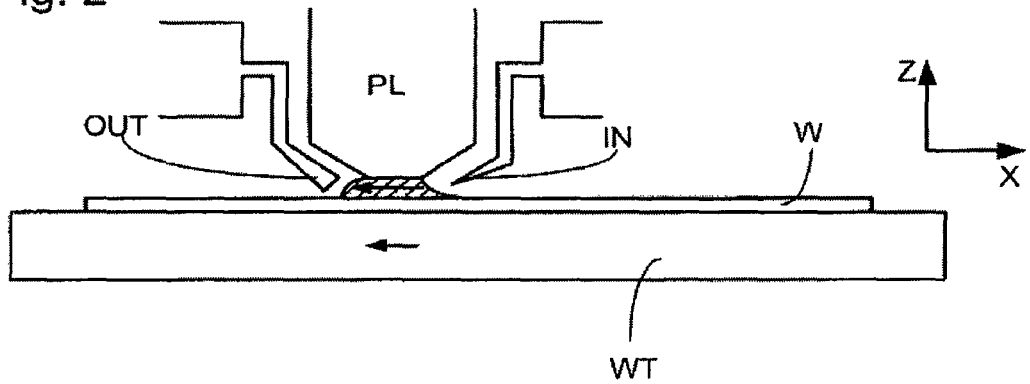
FIGS. 2 and 3 depict a fluid handling structure used in a lithographic projection apparatus.
Figure 3:
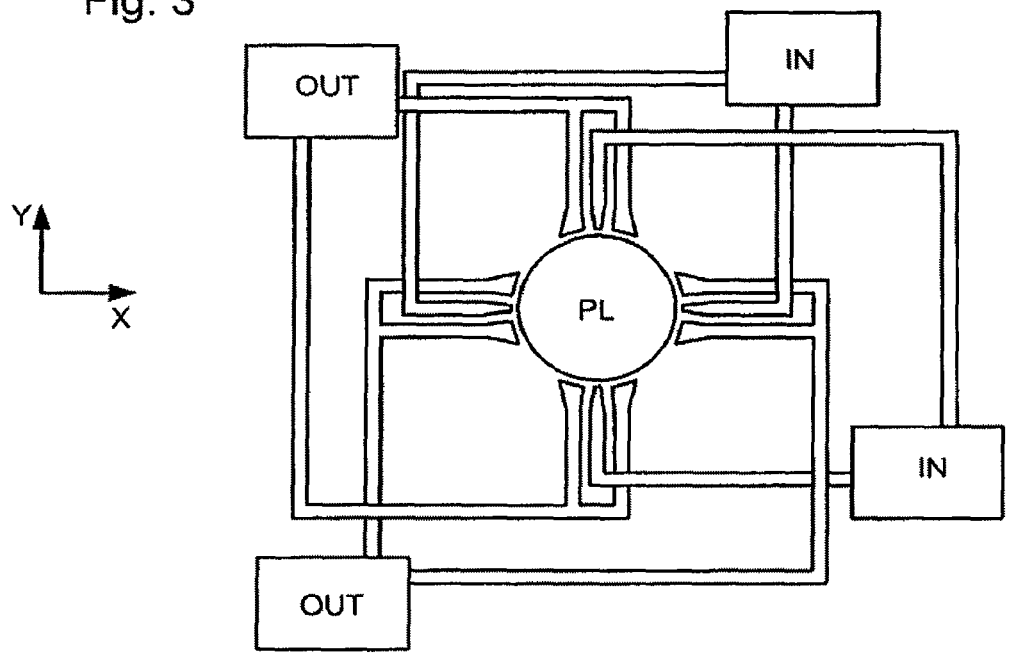
Figure 4:
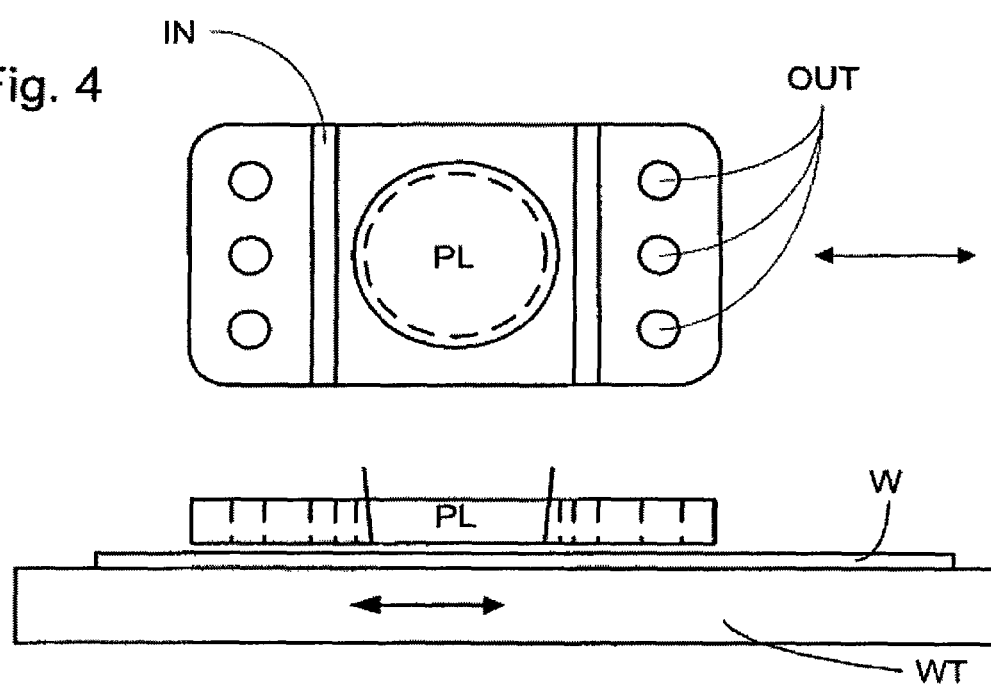
FIG. 4 depicts a fluid handling structure according to another lithographic projection apparatus.

Also one or more additional liquid removal devices 200 may be provided to remove any liquid left on the substrate W. The liquid removal device may be fixed in position relative to the projection system so that the normal movement of the substrate table under the projection system during a series of exposures sweeps the substrate under it. The liquid removal device 200 may be provided with its own positioner. The liquid removal device 200 may be used when the fluid handling structure 12 does not have a liquid removal system 100. For example, if the fluid handling structure may be of one of the types fluid handling structures depicted in FIGS. 2-4, and described above or a type which uses a gas knife to confine the immersion liquid, e.g., as disclosed in United States patent application publication no. US 2004-0207824, which is incorporated herein by reference.

Figure 6:
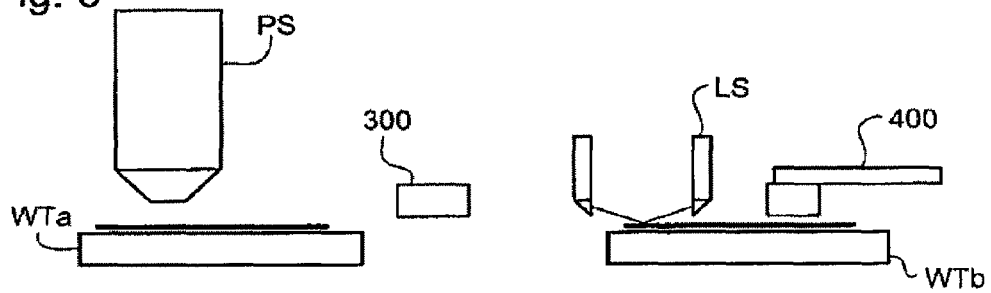
FIG. 6 depicts other arrangements in the substrate stage of a lithographic apparatus including liquid removal devices.

A liquid removal device may alternatively, or in addition, be placed at other positions in a lithographic apparatus. For example, as shown in FIG. 6, a liquid removal device 300 may be positioned between an exposure station, at which a substrate on a wafer table WTa is exposed, and a measurement station at which measurements are taken. A measurement taken at the measurement station may be a height map using a level sensor LS. Substrates may be loaded onto and off a substrate table at the measurement station. Liquid removal device 300 may be sufficiently large and suitably positioned so that the whole of the substrate is swept as the substrate table passes beneath it when transferring between stations. A liquid removal device 400 may be positioned at the measurement station to dry the substrate on a wafer table WTb in conjunction with the taking of measurements. The liquid removal device 400 may be provided with its own positioning system. The liquid removal device may located outside a lithographic device, for example in the track. There it would have the same features as any of the liquid removal devices herein 200, 300, 400 described.

Figure 7:
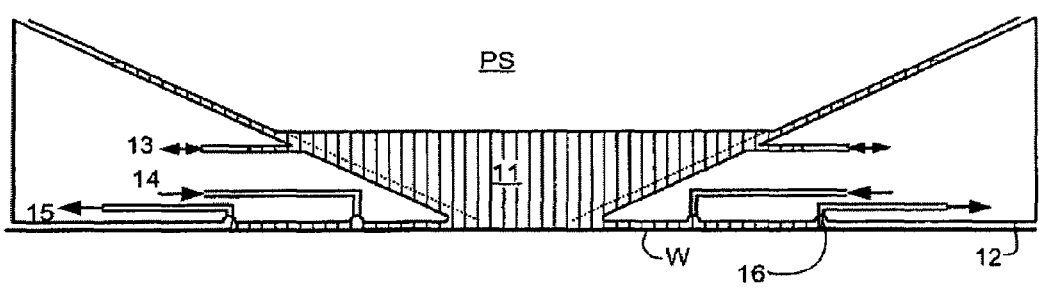
FIG. 7 depicts, in cross-section, a barrier member forming part of the fluid handling structure of FIG. 5.

The fluid handling structure is schematically depicted in FIG. 7. It forms part of a localized immersion system. The fluid handling structure is arranged to control, in particular to supply and to confine, immersion liquid to a space between the final element of the projection system PS (see FIG. 1) and the substrate W. The main part of the fluid handling structure is barrier member 12, which extends along at least a part of a boundary of the space between the final element of the projection system and the substrate. Barrier member 12 is substantially stationary relative to the projection system in the XY plane, though there may be some relative movement in the Z direction (in the direction of the optical axis).

Barrier member 12 is a structure which may at least partly contain liquid in the space 11 between a final element of the projection system PS and the substrate W. Immersion liquid is provided via liquid opening 14, i.e., it is an inlet, and fills the space between the substrate surface and the final element of the projection system. The space is at least partly delimited by barrier member 12 positioned below and surrounding the final element of the projection system PS. Liquid may be supplied to or removed from the space via inlet-outlet 13. Barrier member 12 may extend a little above the final element of the projection system. The liquid level may rise above the final element so that a buffer of liquid is provided. Barrier member 12 has an inner periphery that at the upper end, in an embodiment, closely conforms to the shape of the projection system or the final element thereof and may, e.g., be round. At the bottom, the inner periphery may closely conform to the shape of the image field IF (see FIG. 5), e.g., rectangular, though this need not be the case.

The liquid 11 in the space is prevented from spilling out over the whole of the surface of the substrate by liquid extraction conduit 15, forming part of liquid removal device 100. Liquid extraction conduit 15 is in fluid communication with a plurality of orifices. The orifices form liquid openings which are disposed around the space occupied by the immersion liquid. The shape and arrangement of these orifices serves to control and in particular stabilize the meniscus 16 of the immersion liquid 11 so as to minimize droplets breaking away from or bubbles entering the immersion liquid.

The openings of the liquid removal device can be conveniently defined by a plate that covers the lower surface of the barrier member 12 and has appropriately shaped apertures. Alternatively, the inlets and outlets can be individual nozzles.

In localized immersion systems, liquid is only provided to a localized area of the substrate. The space 11 filled by liquid, i.e., the reservoir, is smaller in plan than the top surface of the substrate. The reservoir remains stationary relative to the projection system PS whilst the substrate W moves underneath it. Another category of immersion system is the bath type arrangement in which the whole of the substrate W and optionally part of the substrate table WT is submersed in a bath of liquid. A further category is the all wet solution in which the liquid is unconfined. In this arrangement the whole top surface of the substrate and optionally all or part of the substrate table is covered in a thin film of immersion liquid. Any of the liquid supply devices of FIGS. 2-5 can be used in such a system. However, their sealing features are not present, are not activated, are not as efficient as normal or are otherwise ineffective to seal liquid to only the localized area. Other arrangements are possible and, as will be clear from the description below, the present invention may be put into practice using any type of immersion or non-immersion lithography apparatus.

In order to print patterns having a smaller pitch than the diffraction limit for a single exposure, various multiple-exposure patterning methods may be used. Embodiment of the present invention concern multiple-exposure lithographic methods in which a first pattern in developed resist is covered by a second layer of resist which is then exposed to a second mask pattern. The present inventors contend that in such processes, the first pattern in the developed resist can affect the exposure of the second resist to the second mask pattern. In particular, because the first pattern is buried within the second resist layer, and is effectively on the same level, in other words in the same layer, as the second pattern that is being exposed in the second exposure, the first pattern in the developed resist sometimes scatters the radiation being used to expose the second resist and thereby disturbs the formation of the second pattern. The inventors contend that the main effect of this scattering is to alter the critical dimensions (CD) of the features of the second pattern. One possible reason for this is that the scattered radiation increases the background irradiation level in the vicinity of some features of the second pattern thereby locally reducing the contrast of the second exposure. It is also possible in some cases that more complex interference effects will occur.

Accordingly, in an embodiment of the invention there is provided a device manufacturing method comprising exposing a first resist layer on a substrate to a first mask pattern to generate a first latent resist pattern in the first resist layer, developing the first latent resist to produce a developed resist pattern, coating the substrate with a second resist layer, which covers the developed pattern in the first resist layer, and exposing the second resist layer to a second mask pattern to form a second latent resist pattern, wherein the second pattern includes a localized pattern adjustments based upon the first mask pattern.

In this way, the effect of the developed resist pattern that exists at the same level as the second resist layer for the second exposure can be compensated for by adjustments to the second mask pattern exposed in the second exposure. The embodiment is applicable where features of the first developed resist pattern are present at the same level as the unexposed second resist layer and may therefore have an impact on the imaging of the second mask pattern in the second resist layer. Thus the embodiment can be applied in double patterning processes where there is no etch step (nor any other step that transfers the first pattern into a hardmask, a sacrificial layer or the substrate) between the first and second exposure steps. Desirably, the substrate is not removed form the lithocell or cluster between the first and second exposures. If the lithographic exposure process involves three or more exposures, the adjustments to a given feature of an exposure after the first may be based on any or all adjacent features of any or all preceding exposures.

In many cases the localized pattern adjustments comprise biasing of features of the second mask pattern that are to be printed adjacent features of the first developed resist pattern. A simple biasing of features of the second mask pattern can effectively compensate for CD variations. The biasing may be applied to whole features in the second mask pattern or only to parts of features of the second mask pattern. In some embodiments, the biasing comprises increasing the critical dimension of features of the second mask pattern that are to be printed adjacent the features of the first developed resist pattern. This is effective in a large number of cases as the reduced contrast caused by radiation scattered by adjacent features in the developed resist of the first pattern causes reduced CD in many cases. For features of the second mask pattern having no adjacent features in the first mask pattern, often no correction is required in the second pattern.

In other cases, for example where more complex interference effects are caused by the first developed resist pattern, other optical proximity correction techniques may be applied. These techniques may include, for example, scattering bars, half-tone features, serifs, etc.

It is known in the prior art to apply adjustments to a pattern to be exposed onto a substrate to compensate for topological variations caused by previous layers of the device being manufactured. However, such known compensations are not applicable to multiple-exposure process for printing a single layer of a device and do not compensate for developed resist patterns embedded in a second resist layer undergoing exposure.

In some embodiments it is desirable to fix the developed resist pattern in the first resist layer before coating the substrate with a second resist layer. Such a step may also be referred to as "freezing" the developed resist pattern although in general this will not be effected by reducing the temperature of the developed resist pattern to effect a phase change. On the contrary, in some embodiments of the invention, the step of fixing the developed resist pattern comprises heating the developed resist pattern. In other embodiments, the step of fixing the developed resist pattern comprises reacting the developed resist pattern with a reagent to form a protective coating. The reaction of the developed resist pattern to form a coating may be effected or enhanced by heating the developed resist pattern when in contact with the reagent. After the protective coating is formed, the reagent can be removed using a developer.

In other embodiments, the second resist layer is of the opposite tone to the first resist layer. For example, the first resist layer may be formed of a positive tone resist and the second resist layer formed of a negative tone resist. In this case, the effect of the developed resist pattern can be rather small as the areas in which the pattern in the first resist has been formed will be dark in the second exposure. Hence, smaller corrections may be required.

In general, the magnitude of the effect of the developed resist pattern on the formation of the second latent resist pattern is dependent on the magnitude of the difference in optical properties between the developed and/or fixed resist pattern and the unexposed second resist layer. This difference is desirably taken into account in determination of the local adjustments to be applied. Also, where the fixing process for the developed resist pattern creates a protective layer, this may result in there being two interfaces, the first being between the second resist layer and the protective coating, the second being between the protective coating and the developed resist pattern, which may result in an increased scattering effect due to scattering from the two interfaces.

Another embodiment of the invention provides a method of multiple-exposure lithographic process comprising assigning a first subset of features to a first mask pattern, wherein the first mask pattern is expose, assigning a second subset of features to a second mask pattern, wherein the second mask pattern is exposed after the first mask pattern is exposed, and applying a localized adjustment to at least one of the second subset of features in the second mask pattern, wherein the adjustment is based on the features of the first mask pattern.

In some embodiments applying a localized adjustment comprises applying biasing to at least one feature of the second substrate of features in the second mask pattern. In particular applying biasing can comprise increasing the critical dimension of the at least one feature.

In some embodiments, applying a localized adjustment can comprise applying at least one adjustment rule to the features of the second mask pattern. The at least one adjustment rule can be derived from a simulation of the formation of at least one test feature using the multiple-exposure lithographic process. Alternatively, the at least one adjustment rule can be derived from at least one test printing of at least one feature using the multiple-exposure lithographic process. A combination of simulation and test printing can also be used to determine one or more rules to be applied.

In some embodiments applying a localized adjustment comprises simulating exposing the first mask pattern and the second mask pattern in the multi-exposure process, comparing the simulated exposures with a desired pattern, and adjusting at least one feature of the second subset of features.

The steps of simulating, comparing and adjusting can be repeated at least once. It is also possible to apply both rule-based adjustments and simulations. For example, a rule-based adjustment is applied, then the exposure of the adjusted pattern is simulated and the results of the simulation used to further adjust the second mask pattern.

The present inventors contend that the effect of the developed resist pattern is dependent on factors including the difference in optical properties, mainly n and k, between the developed first resist and the undeveloped second resist, the exact shape of the features of the developed resist pattern, for example size of footings and sidewall angle, and the distance between the features of the first and second patterns. Hence process and pattern specific simulations and test prints are more likely to give accurate compensation adjustments or rules than more general simulations.

In an embodiment of the invention, the step of assigning features to the first mask pattern is carried out with reference to the predicted effects that features of the desired pattern would have on a subsequent exposure. The proximity effects of the first exposure on the second exposure can be further reduced by appropriate choice of which features to put in the first and second exposures, subject to the overriding constraints of the diffraction limits. For example, consider a case where a long line feature and a short line feature are to be formed adjacent each other in a single layer in two exposures. If the short line is exposed in the first exposure, when the long line is printed in the second exposure, it will experience different proximity effects in the part that is adjacent the short line than in the part that is not adjacent the short line. Thus different adjustments, e.g., linewidth biasing, will need to be applied to the different parts of the long line. On the other hand, if the long line is printed first, the short line will experience the same proximity effects from the long line along its whole length and the same adjustment can be applied to the whole of it. Thus in some cases appropriate choice of which features are exposed in which exposure step can simplify the adjustments that need to be applied in the second exposure. This approach may even in some cases avoid the need for adjustments of the second mask pattern based on the first mask pattern and so can be applied without such adjustments.

Another embodiment of the invention is a method of generating mask patterns comprising Selecting a first mask pattern, wherein the first mask pattern comprises a first subset of features of a desired pattern, and selecting a second mask pattern, wherein the second mask pattern is exposed after the first mask pattern is exposed in a lithographic process in which the second mask pattern comprises a second subset of features of the desired pattern, wherein a feature of the second subset of the features of the desired pattern have been adjusted based on the first subset of the desired features.

In an embodiment, the feature of the second subset of the features of the desired pattern has been adjusted by applying a bias. The bias can be an increase in the CD of the feature. The set of mask patterns can be embodied in a set of masks comprising a first mask and a second mask, each comprising a substrate having a patterned layer, the patterned layers of the first and second masks respectively embodying the first and second mask patterns.

Figure 8:
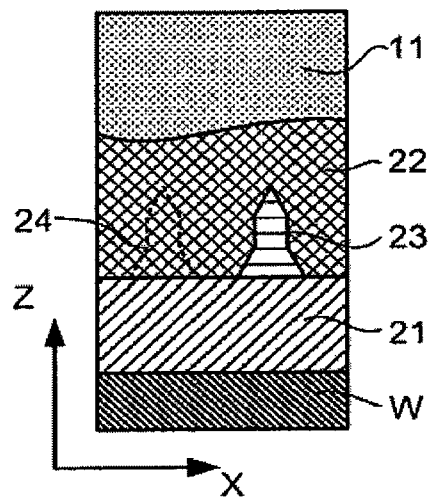
FIG. 8 depicts in vertical cross-section a pattern printed according to a first embodiment of a method according to the invention.
Figure 9:
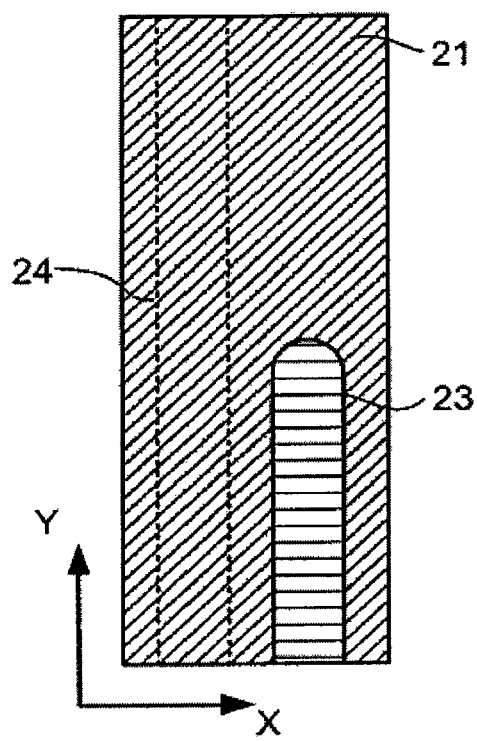
FIG. 9 depicts in horizontal cross-section the pattern of FIG. 8.

FIGS. 8 and 9 are, respectively, a vertical (parallel to the XZ plane) and horizontal (parallel to the XY plane) cross-section of a simulated exposure step according to an embodiment of the present invention. FIGS. 8 and 9 show a single feature 23 exposed in a first exposure process and a single feature 24 to be exposed in a second exposure process and accordingly represent merely a part of a larger pattern to be exposed. Consideration of just these features is sufficient for explanatory purposes.

FIG. 8 shows a bottom anti-reflective coating 21 disposed above the uppermost layer, e.g., a polysilicon layer, of a substrate W. Feature 23 is disposed upon the bottom anti-reflective coating 21. This has been formed in a first exposure process and fixed by thermal processing so as not to be soluble in resist 22 which has been deposited over it for the second exposure process. Shown in phantom is second feature 24 that is to be formed in the second exposure process. Above the second resist 22, immersion liquid 11 is provided for the second exposure.

Figure 10:
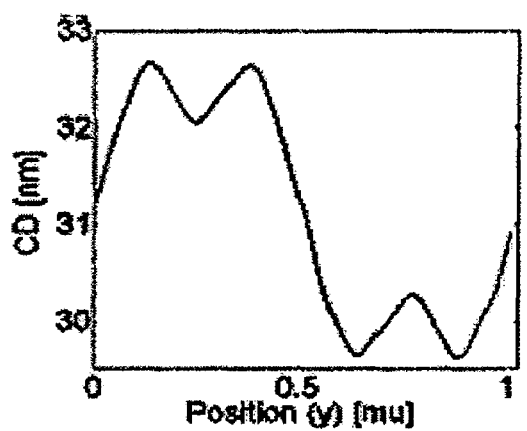
FIG. 10 depicts the variation in critical dimensions (CD) occurring if the pattern of FIG. 8 is printed without the use of the invention.

As illustrated in FIG. 9, the first feature 23 is short, extending in the Y direction only about half the length of the simulated cell. The proximity effect of the first feature 23 on the second feature 24, which extends across the whole length of the simulated cell, is shown in FIG. 10. This graph shows the critical dimension (width) of the second feature 24 as a function of Y position in the absence of any local adjustment. It will be seen that there is a variation of up to about 3 nm between the parts of the second feature 24 that are adjacent first feature 23, and those which are not. The zero Y position is at the bottom of FIG. 9 and it can be seen that the part of feature 24 with reduced line width is the part not adjacent feature 23. This difference in CD can be compensated for by appropriate localized adjustments to the width of feature 24 in the second mask pattern.

Figure 11:
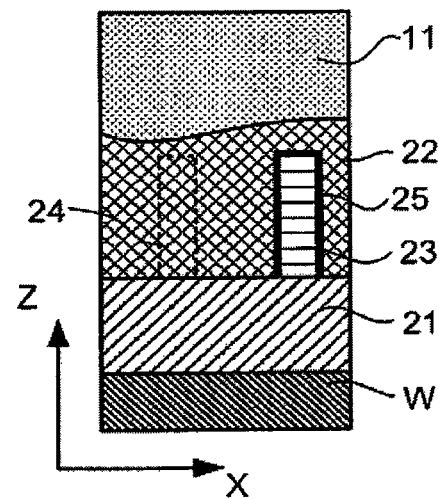
FIG. 11 depicts in vertical cross-section a pattern printed according to a second embodiment of a method according to the invention.
Figure 12:
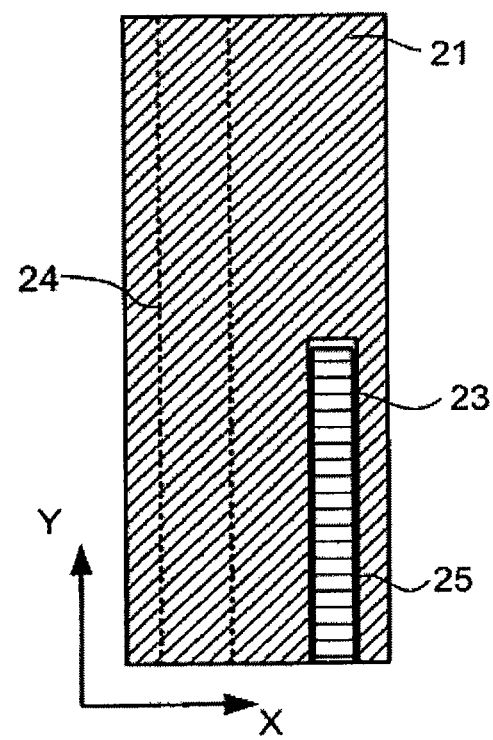
FIG. 12 depicts in horizontal cross-section the pattern of FIG. 11.
Figure 13:
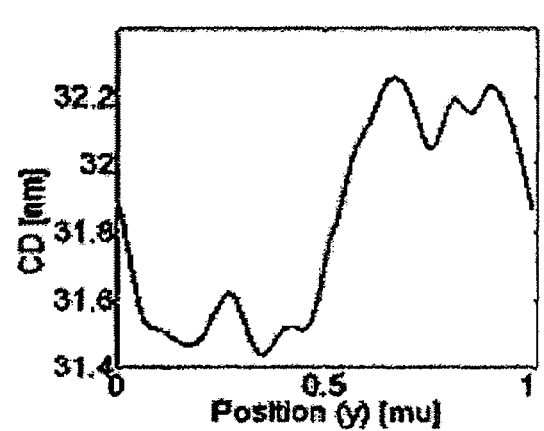
FIG. 13 depicts the variation in CD occurring if the pattern of FIG. 11 is printed without the use of the invention.

FIGS. 11 and 12 are views similar to FIGS. 8 and 9 of a second example of an exposure process to which the present invention can be applied. In FIGS. 11 and 12 features that are the same as or correspond to those features of FIGS. 8 and 9 and have the same reference numerals will not be further described except as set forth below. In this simulation, feature 23 has been fixed by a reaction process so as to form a protective coating 25. Again, a variation in CD of second feature 24 when no adjustments are effected between the parts adjacent first feature 23 and those parts not adjacent first feature 23 can be seen in FIG. 13. Coordinate zero Y is at the bottom in FIG. 12 and FIG. 13 shows the opposite effect than was shown in the first simulation, i.e., the line width of the second feature is reduced in the part adjacent feature 23. Again, this difference in CD can be compensated for by appropriate localized adjustments of the CD of feature 24 in the second mask pattern.

The differences in CD variations between the first and second simulations illustrate the different effects of different shapes of the first feature. These different shapes may arise from differences in the exposure conditions for the first exposure and/or process used to fix the first pattern. Desirably therefore all process conditions relevant to formation of the first pattern are taken account of in the adjustment applied to the second pattern.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) and Extreme Ultraviolet radiation (EUV).

The term "lens," where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

The descriptions above are intended to be illustrative, not limiting. Thus, it will be apparent to one skilled in the art that modifications may be made to the invention as described without departing from the scope of the claims set out below.

What is claimed is:

1. A device manufacturing method, comprising:
   exposing a first resist layer on a substrate to a first mask pattern to generate a first latent resist pattern;
   developing the first latent resist pattern to produce a developed resist pattern;
   coating the substrate with a second resist layer, which covers the developed resist pattern; and
   exposing the second resist layer to a second mask pattern through a mask,
   wherein the second mask pattern includes a localized pattern adjustment made to a feature on the mask based upon the first pattern.

2. The method of claim 1, wherein the localized pattern adjustment comprises biasing of a feature of the second mask pattern located adjacent to a feature of the developed resist pattern.

3. The method of claim 2, wherein the biasing comprises increasing a critical dimension of the feature of the second mask pattern.

4. The method of claim 1, further comprising fixing of the developed resist pattern before coating the substrate with the second resist layer.

5. The method of claim 4, wherein the fixing of the developed resist pattern comprises heating the developed resist pattern.

6. The method of claim 4, wherein the fixing of the developed resist pattern comprises reacting the developed resist pattern with a reagent to produce a protective coating.

7. The method of claim 1, wherein the second resist layer is of an opposite tone to the first resist layer.

8. A multiple-exposure lithographic method, comprising:
   using a first subset of features of a first mask pattern during a first exposure period;
   using a second subset of features of a second mask pattern during a second exposure period through a mask; and
   performing a localized adjustment to at least one feature on the mask, wherein the adjustment is based on the features of the first mask pattern.

9. The method of claim 8, wherein the performing comprises biasing the at least one feature of the second subset of features in the second mask pattern.

10. The method of claim 9, wherein the biasing comprises increasing a critical dimension of the at least one feature.

11. The method of claim 8, wherein the performing comprises applying at least one adjustment scenario to the at least one feature.

12. The method of claim 11, wherein the at least one adjustment is based on a simulation of the formation of at least one test feature using the multiple-exposure lithographic process.

13. The method of claim 11, wherein the at least one adjustment scenario is based on a at least one test printing of at least one feature using the multiple-exposure lithographic process.

14. The method of claim 8, wherein the performing comprises:
   simulating exposing the first mask pattern and the second mask pattern;
   comparing the simulated exposures with a desired pattern; and
   adjusting at least one feature of the second subset of features.

15. The method of claim 14, further comprising repeating the simulating, comparing, and adjusting.

16. The method of claim 8, wherein the using features of the first mask pattern is based on a predicted effect that a feature of a desired pattern has on a subsequent exposure.

17. A method comprising:
   generating a first mask pattern to be formed on a substrate, wherein the first mask pattern comprises a first subset of features of a desired pattern; and
   generating a second mask pattern to be formed on a substrate, wherein the second mask pattern is exposed through a mask after the first mask pattern is exposed in a lithographic process in which the second mask pattern comprises a second subset of features of the desired pattern,
   wherein a feature on the mask has been adjusted based on the first subset of the desired features.

18. The method of claim 17, wherein a feature of the second subset of features of the desired pattern has been adjusted by applying a bias.

19. The method of claim 18, wherein the bias is an increase in the critical dimensions of the feature.

* * * * *